(12) United States Patent
Ohta et al.

(10) Patent No.: US 12,573,676 B2
(45) Date of Patent: Mar. 10, 2026

(54) BATTERY UNIT

(71) Applicant: HONDA MOTOR CO., LTD., Tokyo (JP)

(72) Inventors: Masahiro Ohta, Saitama (JP); Kazuki Chiba, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 1008 days.

(21) Appl. No.: 17/669,369

(22) Filed: Feb. 11, 2022

(65) Prior Publication Data

US 2022/0320615 A1 Oct. 6, 2022

(30) Foreign Application Priority Data

Mar. 30, 2021 (JP) ................................. 2021-058637

(51) Int. Cl.
    *H01M 10/48* (2006.01)
    *G01R 31/392* (2019.01)
        (Continued)

(52) U.S. Cl.
    CPC ........ *H01M 10/486* (2013.01); *G01R 31/392* (2019.01); *H01M 10/482* (2013.01);
        (Continued)

(58) Field of Classification Search
    CPC ............. H01M 10/486; H01M 10/425; H01M 10/482; H01M 10/613; H01M 10/6554;
        (Continued)

(56) References Cited

U.S. PATENT DOCUMENTS

| 2009/0130538 A1 | 5/2009 | Kaita et al. |
| 2010/0052617 A1 | 3/2010 | Aridome et al. |
| | (Continued) | |

FOREIGN PATENT DOCUMENTS

| CN | 101499544 A | 8/2009 |
| CN | 107367693 A | 11/2017 |
| | (Continued) | |

OTHER PUBLICATIONS

Xu Xiaoming et al., "Power battery system design" Machinery Industry Press , pp. 126-127 , Jan. 31, 2019.

(Continued)

*Primary Examiner* — Lingwen R Zeng
(74) *Attorney, Agent, or Firm* — CKC & Partners Co., LLC

(57) ABSTRACT

A battery unit includes at least one battery module that includes at least one battery cell, at least one battery heat flow detector that detects a heat flow of the at least one battery cell and the battery unit, at least one reference heat flow detector that detects a heat flow of the battery unit as a reference heat flow, and a battery state estimator that estimates a state of the at least one battery cell, based on a heat flow of the at least one battery cell given by subtracting the reference heat flow detected by the at least one reference heat flow detector from the heat flow detected by the at least one battery heat flow detector. The at least one reference heat flow detector is disposed in the battery unit at a location where temperature fluctuation is small and heat capacity is large.

7 Claims, 6 Drawing Sheets

(51) Int. Cl.

| | |
|---|---|
| *H01M 10/6554* | (2014.01) |
| *H01M 50/505* | (2021.01) |
| *G01R 31/382* | (2019.01) |
| *G01R 31/385* | (2019.01) |
| *H01M 10/42* | (2006.01) |
| *H01M 10/613* | (2014.01) |
| *H01M 10/6572* | (2014.01) |
| *H01M 50/249* | (2021.01) |

(52) U.S. Cl.
CPC ..... *H01M 10/6554* (2015.04); *H01M 50/505* (2021.01); *G01R 31/382* (2019.01); *G01R 31/385* (2019.01); *H01M 10/425* (2013.01); *H01M 10/613* (2015.04); *H01M 10/6572* (2015.04); *H01M 50/249* (2021.01); *H01M 2220/20* (2013.01); *Y02E 60/10* (2013.01)

(58) Field of Classification Search
CPC ......... H01M 10/6572; H01M 2220/20; H01M 50/249; H01M 50/505; Y02E 60/10; G01R 31/382; G01R 31/385; G01R 31/392
See application file for complete search history.

(56) References Cited

U.S. PATENT DOCUMENTS

| | | | | |
|---|---|---|---|---|
| 2011/0020676 | A1* | 1/2011 | Kurosawa | H01M 10/653 429/62 |
| 2011/0287285 | A1* | 11/2011 | Yoon | B60L 1/003 429/9 |
| 2012/0166116 | A1 | 6/2012 | Yoshida et al. | |
| 2013/0108904 | A1 | 5/2013 | Okabayashi | |
| 2017/0200994 | A1* | 7/2017 | Kim | H01M 10/486 |
| 2020/0132774 | A1 | 4/2020 | Hara et al. | |

FOREIGN PATENT DOCUMENTS

| | | | |
|---|---|---|---|
| CN | 110870130 | A | 3/2020 |
| JP | H08308131 | A | 11/1996 |
| JP | 5044511 | B2 | 10/2012 |
| JP | 2013005482 | A | 1/2013 |
| JP | 5287844 | B2 | 9/2013 |
| JP | 2015072878 | A | 4/2015 |
| WO | 2017158727 | A1 | 9/2017 |

OTHER PUBLICATIONS

Decision of Refusal issued Oct. 31, 2024 in the CN Patent Application No. 202210115743.8.

Zhang Xiaohui et al., "Electrician Training" Machinery Industry Press, Aug. 31, 2001, pp. 90-91.

Office Action issued in the CN Patent Application No. 202210115743.8, mailed on Mar. 29, 2024.

* cited by examiner

BATTERY UNIT

This application is based on and claims the benefit of priority from Japanese Patent Application No. 2021-058637, filed on 30 Mar. 2021, the content of which is incorporated herein by reference.

BACKGROUND OF THE INVENTION

Field of the Invention

The present disclosure relates to a battery unit.

Related Art

There is a technique for estimating a state, such as a state of charge (SOC) or a state of health (SOH), of a battery cell in a battery unit. For example, it has been known that a state of a battery cell, such as the SOC or the SOH, correlates with a voltage of the battery cell. Therefore, according to some known techniques, a state of a battery cell, such as the SOC or the SOH, is estimated based on a voltage of the battery cell (see, for example, Patent Documents 1 and 2).

Patent Document 1: Japanese Patent No. 5287844
Patent Document 2: Japanese Patent No. 5044511

SUMMARY OF THE INVENTION

In the case of battery cells in which a voltage has a gradient with respect to a change in capacity, such as a lithium-ion battery (secondary battery) including hard carbon as a material forming the negative electrode, a state of the battery cell (e.g., the SOC or the SOH) can be accurately estimated based on a voltage of the battery cell. On the other hand, there have recently been battery cells in which a change in voltage is small with respect to a change in capacity, such as a lithium-ion battery (secondary battery) including graphite as a material forming the negative electrode. In the case of a battery unit including battery cells of this type, if a state of the battery cells (e.g., the SOC or the SOH) is estimated based on a voltage of the battery cells, the accuracy of the estimation is expected to be reduced.

It is an object of the present disclosure to provide a battery unit capable of inhibiting a decrease in accuracy of estimation of a state of a battery cell even if the battery cell is of a type in which a change in voltage is small with respect to a change in the state of the battery cell.

The present inventor(s) has found that there is a correlation between a state of a battery cell (e.g., the SOC or the SOH) and a heat flow of the battery cell that is generated when a phase transition occurs in an active material contained in an electrode material. The present inventor(s) has also found that even in the case of a battery cell in which a change in voltage is small with respect to a change in a state of the battery cell (e.g., the SOC or the SOH), a change in a heat flow of the battery cell is relatively large with respect to a change in a state of the battery cell (e.g., the SOC or the SOH). Accordingly, the present inventor(s) has devised a method for estimating a state of a battery cell (e.g., the SOC or the SOH) based on a heat flow of the battery cell.

Here, simply detecting a heat flow of a battery cell is expected to provide not the exact heat flow, but the heat flow affected by various heat flows in the battery unit, namely effects of noise. Therefore, an estimation of the state of the battery cell (e.g., the SOC or the SOH) based on the heat flow simply detected in this way is expected to be of low accuracy.

In view of the foregoing, a first aspect of the present disclosure is directed to a battery unit including: at least one battery module that includes at least one battery cell; at least one battery heat flow detector that detects a heat flow of the at least one battery cell and the battery unit; at least one reference heat flow detector that detects a heat flow of the battery unit as a reference heat flow; and a battery state estimator that estimates a state of the at least one battery cell, based on a heat flow of the at least one battery cell given by subtracting the reference heat flow detected by the at least one reference heat flow detector from the heat flow detected by the at least one battery heat flow detector. The at least one reference heat flow detector is disposed in the battery unit at a location where temperature fluctuation is small and heat capacity is large.

In the battery unit according to a second aspect of the present disclosure, the at least one battery heat flow detector and the at least one reference heat flow detector may each include a temperature sensor that detects a temperature as the respective heat flow.

In the battery unit according to a third aspect of the present disclosure, the at least one battery module may include a stack including the at least one battery cell including a plurality of battery cells stacked together, and end plates sandwiching the stack. The at least one battery heat flow detector may be disposed on or adjacent to at least one of the plurality of battery cells.

In the battery unit according to a fourth aspect of the present disclosure, the at least one reference heat flow detector may include a plurality of reference heat flow detectors disposed on or adjacent to the end plates.

In the battery unit according to a fifth aspect of the present disclosure, the plurality of reference heat flow detectors may be respectively disposed on or adjacent to surfaces of the end plates, the surfaces not facing the battery cells.

The battery unit according to a sixth aspect of the present disclosure may further include a cooling plate for cooling the at least one battery module, and the at least one reference heat flow detector may be disposed on or adjacent to the cooling plate.

In the battery unit according to a seventh aspect of the present disclosure, the at least one reference heat flow detector may be disposed on or adjacent to a surface of the cooling plate, the surface not facing the battery cells.

In the battery unit according to an eighth aspect of the present disclosure, the at least one battery module may further include a bus bar connecting the plurality of battery cells to each other, and the at least one reference heat flow detector may be disposed on or adjacent to the bus bar.

In the battery unit according to a ninth aspect of the present disclosure, the at least one reference heat flow detector is disposed on or adjacent to a surface of the bus bar, the surface not facing the battery cells.

In the battery unit according to a tenth aspect of the present disclosure, the at least one battery module may include a plurality of battery modules. The battery unit may further include a bus bar connecting the plurality of battery modules to each other. The at least one reference heat flow detector may be disposed on or adjacent to the bus bar.

In the battery unit according to an eleventh aspect of the present disclosure, the at least one reference heat flow detector may be disposed on or adjacent to a surface of the bus bar, the surface not facing the battery cells.

In the battery unit according to a twelfth aspect of the present disclosure, the at least one reference heat flow detector may be disposed on or adjacent to a flange via which the at least one battery module is fixed.

In the battery unit according to a thirteenth aspect of the present disclosure, the at least one reference heat flow detector may be disposed in a floating manner in a space within the battery unit.

In the battery unit according to a fourteenth aspect of the present disclosure, the at least one reference heat flow detector may be disposed inside or outside a pipe that protects a high-voltage conductor wire.

In the battery unit according to a fifteenth aspect of the present disclosure, the at least one battery heat flow detector may include a plurality of battery heat flow detectors, two of which may be disposed on or adjacent to ones of the plurality of battery cells, the ones being located next to the end plates.

In the battery unit according to a sixteenth aspect of the present disclosure, the plurality of battery heat flow detectors may further include one battery heat flow detector disposed on or adjacent to one of the plurality of battery cells, the one being located at a center of the battery module.

In the battery unit according to a seventeenth aspect of the present disclosure, the at least one battery heat flow detector may include a plurality of battery heat flow detectors, two of which are disposed on or adjacent to ones of the plurality of battery cells, the ones being located next to the end plates. The at least one reference heat flow detector may be disposed at one of the plurality of battery cells, the one being different from those on or adjacent to which the two battery heat flow detectors are disposed.

In the battery unit according to an eighteenth aspect of the present disclosure, a thermocouple may be installed at a location where the at least one battery heat flow detector or/and the at least one reference heat flow detector is/are disposed.

In the battery unit according to a nineteenth aspect of the present disclosure, the state of the at least one battery cell may be a state of charge SOC or a state of health SOH.

In the battery unit according to a twentieth aspect of the present disclosure, the at least one battery heat flow detector and the at least one reference heat flow detector may each be a Peltier element.

According to the first to eighteenth aspects, the state of the battery cell is estimated based on the heat flow of the battery cell. This feature makes it possible to inhibit a decrease in accuracy of the estimation of the state of the batter cell even if the battery cell is of a type in which a change in voltage is small with respect to a change in the state of the battery cell. In addition, the state of the battery cell is estimated based on the heat flow of the battery cell given by subtracting the reference heat flow detected by the reference heat flow detector from the heat flow detected by the battery heat flow detector. This feature makes it possible to estimate the state of the battery cell based on the heat flow of the battery cell, the heat flow excluding effects of various heat flows in the battery unit, namely effects of noise. As a result, a decrease in the accuracy of the estimation of the state of the battery cell can be inhibited.

According to the fourth to fourteenth aspects, the reference heat flow detector is appropriately disposed in the battery unit at a location where temperature fluctuation is small and heat capacity is large.

According to the twentieth aspect, the Peltier element can be used for both cooling the battery cell and detecting the heat flow. For example, the Peltier element can be used as a heat flow sensor when the heat flow is to be detected, and otherwise, it can be used as a cooler.

BRIEF DESCRIPTION OF THE DRAWINGS

FIG. 6 is a diagram illustrating an example of a table map of closed circuit voltage CCV-SOC reference characteristics (e.g., initial characteristics) of the comparative example.

DETAILED DESCRIPTION OF THE INVENTION

Figure 1:
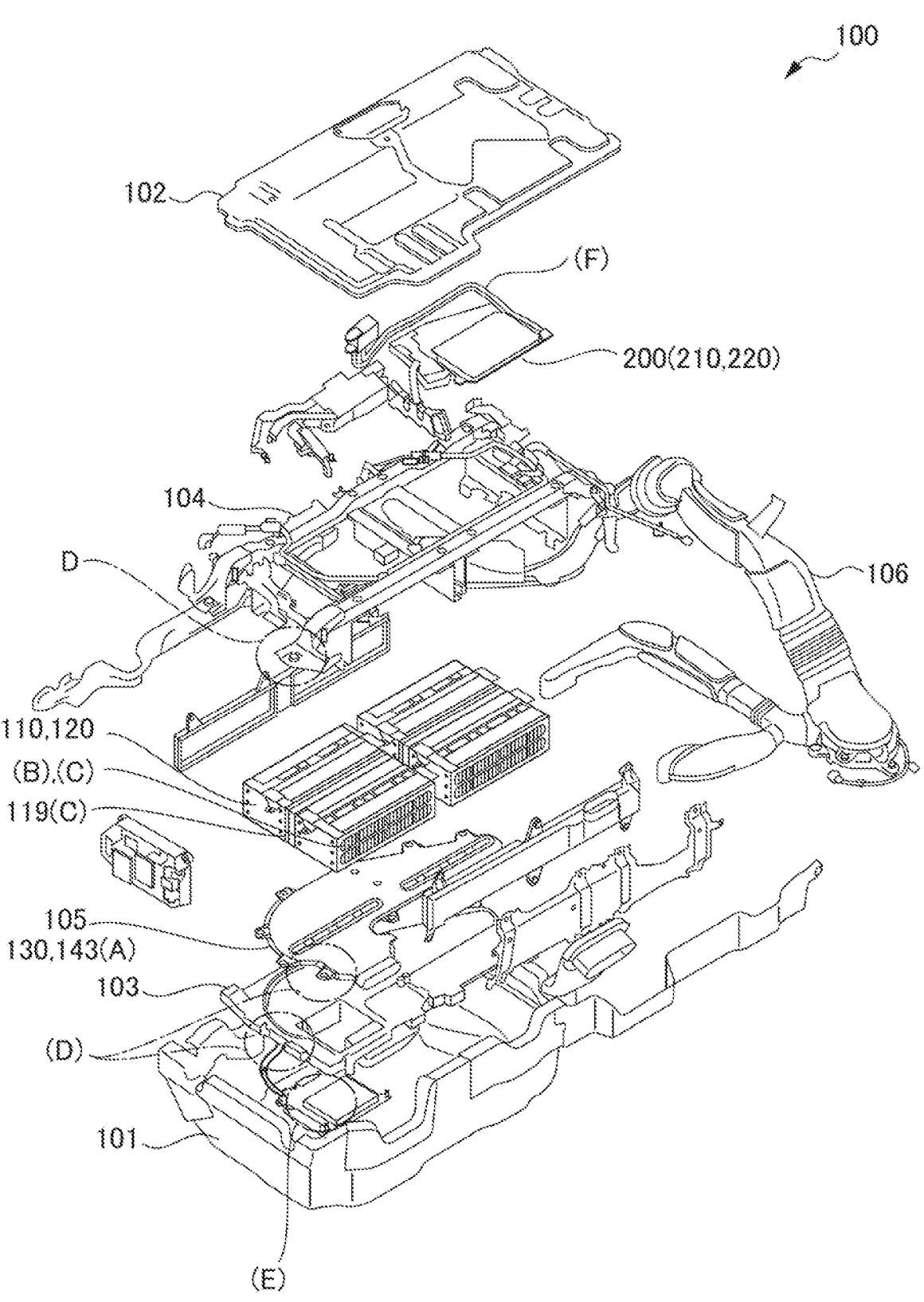
FIG. 1 is an exploded perspective view illustrating a battery unit according to an embodiment.

An example of embodiments of the present disclosure will be described below with reference to the accompanying drawings. In the drawings, the same or equivalent components are denoted by the same reference character.

(Battery Unit)

Figures 2A, 2B:
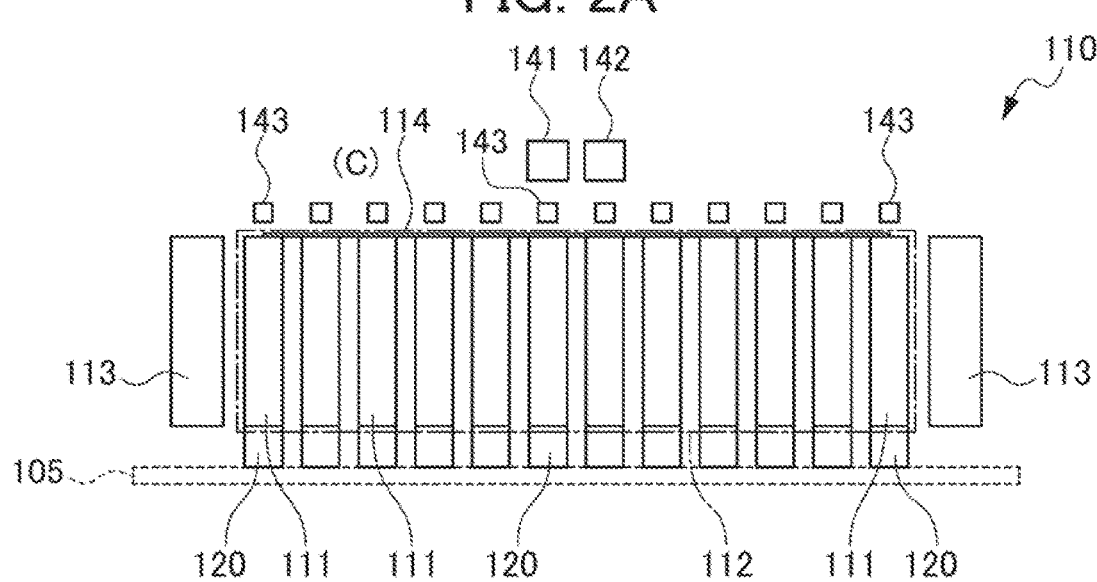
FIG. 2A is a side view illustrating an example of a battery module that can be included in the battery unit illustrated in FIG. 1.
FIG. 2B is a side view illustrating another example of a battery module that can be included in the battery unit illustrated in FIG. 1.

FIG. 1 is an exploded perspective view illustrating a battery unit according to the present embodiment. FIG. 2A is a side view illustrating an example of a battery module that can be included in the battery unit illustrated in FIG. 1. The battery unit 100 illustrated in FIG. 1 is a battery pack (also referred to as an intelligent power unit: IPU) mountable on an electric vehicle, such as a hybrid electric vehicle (HEV), a hybrid electric vehicle with an external power supply function (plug-in hybrid electric vehicle: PHEV), or a battery electric vehicle (BEV).

As illustrated in FIGS. 1 and 2A, the battery unit 100 includes, as main components, battery modules 110, battery heat flow detectors 120, a reference heat flow detector 130, a voltage detector 141, a current detector 142, temperature detectors 143, and a battery management system (BMS) 200. In the example illustrated in FIG. 1, the components of the battery unit 100 are housed in a case 101 and covered with a cover 102.

In the example illustrated in FIG. 1, the battery unit 100 further includes a lower frame 103 and an upper frame 104. The battery unit 100 further includes a lower cooling plate 105 for cooling the battery modules 110. The battery unit 100 further includes a mechanism 106 (e.g., a fan, a cooling air duct, and an intake duct) that introduces air to cool the battery modules 110.

As illustrated in FIG. 2A, each battery modules 110 has, as main components, a stack 112 including a plurality of battery cells 111 stacked together, a pair of end plates 113 sandwiching the stack 112 in the stacking direction, and a cell bus bar 114 connecting the plurality of battery cells 111 to each other. As illustrated in FIG. 1, the plurality of battery modules 110 may be connected to each other via a module bus bar 119.

The battery cells 111 may be any type of battery cell, non-limiting examples of which include lithium-ion batteries. Among such lithium-ion batteries, the following battery is preferable: a lithium-ion battery with a negative electrode containing a material that generates heat when a phase transition occurs, such as graphite; or a lithium-ion battery with a positive electrode containing a material that generates heat when a phase transition occurs, such as lithium cobalt oxide (LCO) as a layered compound or lithium nickel oxide (LNO) as a layered compound.

The battery heat flow detectors 120 are heat flow sensors that detect a heat flow of the battery cells 111 and the battery unit 100. In other words, the heat flow detected by the battery heat flow detectors 120 is composed of not only the heat flow of the battery cells 111, but also a heat flow affected by various heat flows in the battery unit 100, namely effects of noise.

The heat flow sensor may be any type of sensor, non-limiting example of which include temperature sensors such as a Peltier element, a thermopile, and a thermocouple. Among these temperature sensors, the Peltier element is preferable. As illustrated in FIG. 2A, a Peltier element for cooling the battery cells 111 may be disposed between the battery cells 111 and the cooling plate 105. In this case, the Peltier element can be used for both heat flow detection and cooling. For example, the Peltier element can be used as a heat flow sensor when a heat flow is to be detected, and otherwise, it can be used as a cooler.

It is only necessary for each battery heat flow detector 120 to be disposed on or adjacent to at least one of the battery cells 111 included in the battery module 110. As illustrated in FIG. 2A, the battery heat flow detectors 120 may be disposed on or adjacent to two of the battery cells 111, the two being located next to the end plates 113. The battery heat flow detector 120 may further be disposed on or adjacent to one battery cell 111 located at the center in the stacking direction of the battery cells 111, in addition to the two battery cells 111 next to the end plates 113.

The reference heat flow detector 130 is a heat flow sensor that detects, as a reference heat flow, a heat flow of the battery unit 100, the heat flow composed of various heat flows in the battery unit 100, namely heat flows of noise.

Similarly to the above, the heat flow sensor may be any type of sensor, non-limiting example of which include temperature sensors such as a Peltier element, a thermopile, and a thermocouple. Among these temperature sensors, the Peltier element is preferable. The Peltier element can be used for both cooling the battery cells 111 and detecting the heat flow.

The reference heat flow detector 130 is disposed in the battery unit 100 at a location where temperature fluctuation is small and heat capacity is large. For example, the reference heat flow detector(s) 130 can be disposed at any of the following locations (A) to (F).

(A) Cooling Plate 105 for Cooling the Battery Modules 110

For example, as illustrated in FIG. 1, the cooling plate 105 is disposed in contact with the bottom surfaces of the battery modules 110, and the reference heat flow detector 130 is disposed on or adjacent to a surface of the cooling plate 105, the surface not facing the bottom surfaces of the battery cells 111. Although the reference heat flow detector 130 can be disposed at any position with respect to the plurality of battery cells 111, it may be disposed at, for example, a position corresponding to one battery cell 111 at the center in the stacking direction of the battery cells 111.

(B) End Plates 113 of the Battery Modules 110

FIG. 2B is a side view illustrating another example of a battery module that can be included in the battery unit illustrated in FIG. 1. As illustrated in FIG. 2B, for example, the reference heat flow detector 130 may be disposed on or adjacent to a surface of each end plate 113, the surface not facing the battery cells 111.

(C) Bus Bar 114, 119 of the Battery Modules 110

For example, the reference heat flow detector 130 may be disposed on or adjacent to a surface of the cell bus bar 114 connecting the battery cells to each other (see FIG. 2A), the surface not facing the battery cells 111. For example, the reference heat flow detector 130 may be disposed on or adjacent to a surface of the module bus bar 119 connecting the battery modules 110 to each other (see FIG. 1), the surface not facing the battery cells 111. Although the reference heat flow detector 130 can be disposed at any position with respect to the plurality of battery cells 111, it may be disposed at, for example, a position corresponding to one battery cell 111 at the center in the stacking direction of the battery cells 111.

(D) Flange in the Battery Unit 100

For example, as illustrated in FIG. 1, the reference heat flow detector 130 may be disposed on or adjacent to a flange (joint) which is provided in the battery unit 100 and via which the battery modules are fixed.

(E) Space within the Battery Unit 100

For example, as illustrated in FIG. 1, the reference heat flow detector 130 may be disposed in a floating manner in a space within the battery unit 100.

(F) Pipe Protecting a High-Voltage Conductor Wire

For example, as illustrated in FIG. 1, the reference heat flow detector 130 may be disposed inside or outside a pipe that protects a high-voltage conductor wire (e.g., inside the pipe if the pipe is exposed to outside air, or outside the pipe if the pipe is not exposed to outside air).

The battery heat flow detectors 120 may be disposed on or adjacent to the two battery cells 111 that are next to the end plates 113, and the reference heat flow detector 130 may be disposed on or adjacent to one of the battery cells 111 that is different from the two on or adjacent to which the battery heat flow detectors 120 are disposed (e.g., one battery cell 111 located at the center in the stacking direction of the battery cells 111).

The voltage detector 141 is a voltage sensor that detects a closed circuit voltage of the battery cells 111. The voltage detector 141 may be disposed at any location. For example, as illustrated in FIG. 2A, the voltage detector 141 may be disposed on or adjacent to the battery module 110.

The current detector 142 is a current sensor that detects a current of the battery cells 111. The current detector 142 may be disposed at any location. For example, as illustrated FIG. 2A, the current detector 142 may be disposed on or adjacent to the battery module 110.

The temperature detectors 143 are temperature sensors that detect temperatures of the respective components. The temperature sensor may be any type of temperature sensor, a non-limiting example of which includes a thermocouple. As illustrated in FIG. 2A, each temperature detector 143 is disposed on or adjacent to an associated one of the battery cells 111 and detects the temperature of the associated battery cell 111. The temperature detectors 143 are also disposed at the positions where the battery heat flow detectors 120 are disposed, and detect temperatures of the heat flow detection positions. As illustrated in FIGS. 1 and 2B, the temperature detectors 143 are also disposed at the positions where the reference heat flow detectors 130 are disposed, and detect temperatures of the heat flow detection positions.

(Battery Management System: Battery State Estimator)

The battery management system (BMS, also referred to as the electronic control unit: ECU) 200 performs overall control of the battery cells 111, including charge/discharge control, over-charge protection, over-discharge protection, and monitoring of a state of the battery (e.g., a state of charge (SOC) or a state of health (SOH)) of the battery cells 111. The battery management system 200 includes, as main components, a battery state estimator 210 and a storage 220.

The battery state estimator 210 includes, for example, an arithmetic processor, such as a digital signal processor (DSP) and a field-programmable gate array (FPGA). The battery state estimator 210 performs various functions by executing, for example, predetermined software (programs) stored in the storage 220. The various functions of the battery state estimator 210 may be performed by way of cooperation of hardware and software, or may be performed only by hardware (electronic circuitry).

For example, the storage 220 is a rewritable memory, such as an EEPROM. The storage 220 stores the predetermined software (programs) for allowing the battery state estimator 210 to perform the above-mentioned various functions.

Figure 3:
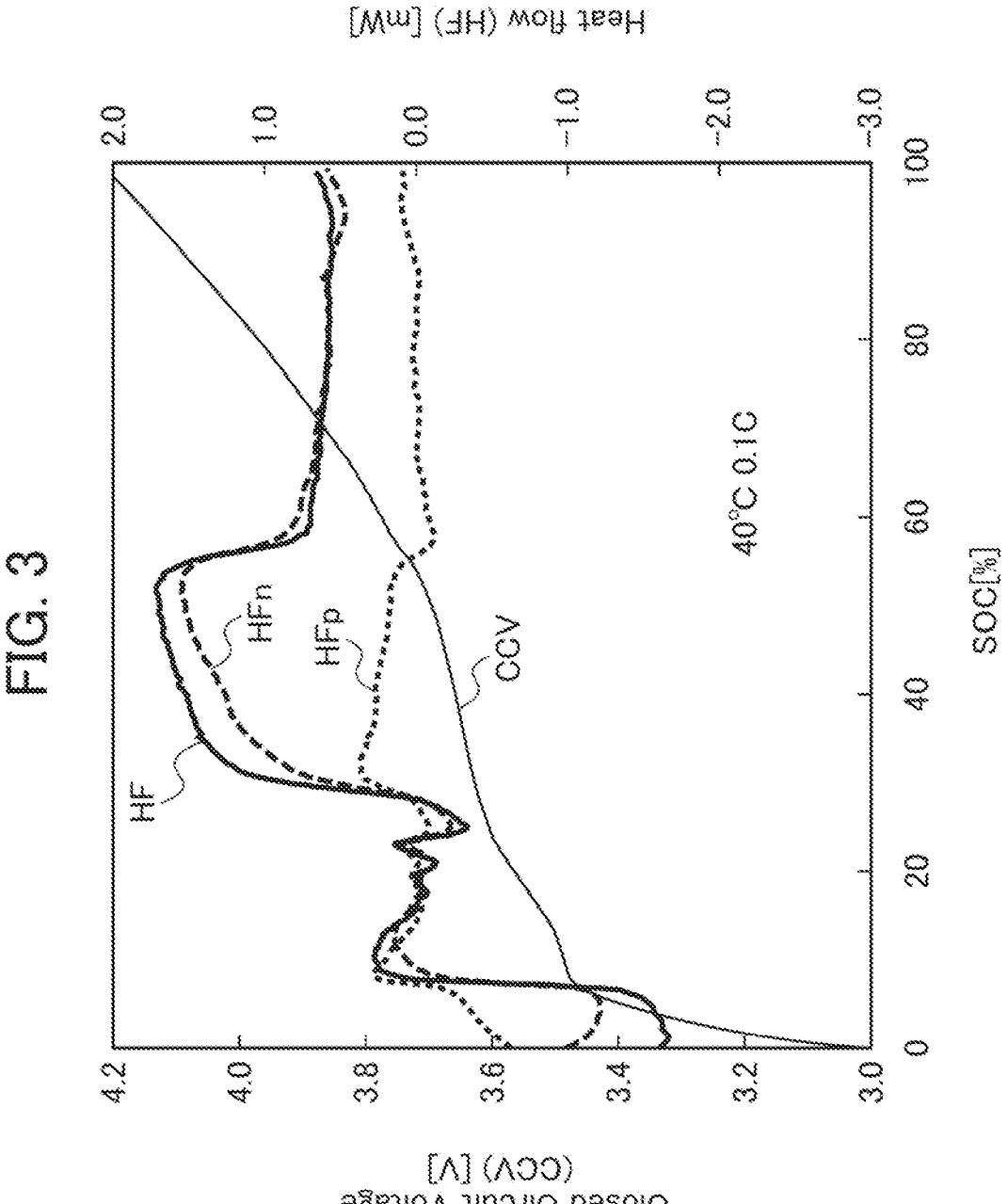
FIG. 3 is a graph illustrating an example of heat flow HF-SOC characteristics of the embodiment.

As illustrated in FIG. 3, the storage 220 stores characteristics relating to a correlation between a heat flow HF and a SoC in an initial state of the battery cells 111 (heat flow HF-SOC initial characteristics), which are a plurality of characteristics of the battery cells 111 each associated with a temperature and a current, in a table map format (e.g., similarly to the closed circuit voltage CCV in FIG. 3, to be described later).

The battery state estimator 210 estimates a state of the battery cells (e.g., the SOC or the SOH) based on a heat flow HF of the battery cells 111 given by subtracting the reference heat flow detected by the reference heat flow detector(s) 130 from the heat flow detected by the battery heat flow detector(s) 120.

(Estimation of SOC)

First, an example of estimation of the SOC of the battery cells 111, which the battery state estimator 210 performs based on the heat flow of the battery cells 111, is described.

The battery state estimator 210 calculates the heat flow of the battery cells 111 and the battery unit 100 from the detection results of the battery heat flow detector(s) 120, and calculates the reference heat flow of the battery unit 100 from the detection results of the reference heat flow detector(s) 130. For example, when the heat flow detectors 120 and 130 are Peltier elements, the battery state estimator 210 converts a detected voltage (V) into a heat flow (W), based on the sensitivity of the Peltier elements. Since a Peltier element is characterized in that its sensitivity varies depending on temperature, a suitable sensitivity is selected based on a temperature detected by a corresponding one of the temperature detectors 143.

The battery state estimator 210 calculates the heat flow HF (HFp, HFn) of the battery cells 111 by subtracting the reference heat flow of the battery unit 100 from the heat flow of the battery cells 111 and the battery unit 100. The heat flow of the battery cells 111 given by this calculation excludes the effects of various heat flows in the battery unit 100, namely the effects of noise. As illustrated in FIG. 3, the heat flow HFp of the battery cells 111 on a positive electrode side and the heat flow HFn of the battery cells 111 on a negative electrode side may be averaged to determine the heat flow HF of the battery cells 111.

Figure 4:
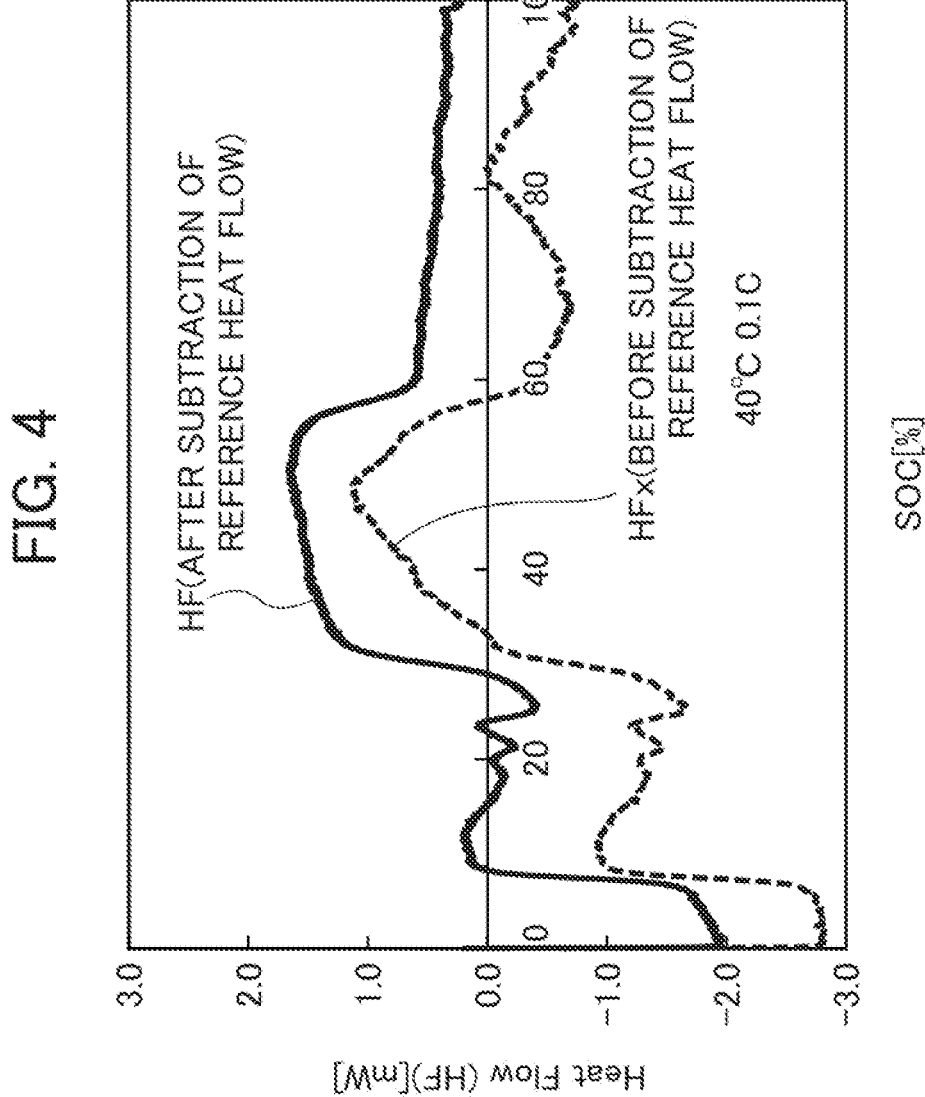
FIG. 4 is a graph illustrating an example of heat flow HF-SOC characteristics after subtraction of a reference heat flow and an example of heat flow HFx-SOC characteristics before the subtraction of the reference heat flow.

As illustrated in FIG. 3, the battery state estimator 210 estimates a SOC corresponding to the detected heat flow HF by referring to previously stored heat flow-SOC reference characteristics (e.g., initial characteristics), which are heat flow-SOC reference characteristics (table map) corresponding to detected temperatures and detected currents. FIG. 3 also illustrates closed circuit voltage CCV-SOC reference characteristics, for reference. FIG. 4 illustrates heat flow HF-SOC characteristics and heat flow HFx-SOC characteristics. The heat flow HF-SOC characteristics relate to the heat flow HF (after subtraction of the reference heat flow) of the battery cells 111, which is given by subtracting the reference heat flow of the battery unit 100 detected by the reference heat flow detector(s) 130 from the heat flow of the battery cells 111 and the battery unit 100 detected by the battery heat flow detector(s) 120. The heat flow HFx-SOC characteristics relate to the heat flow HFx (before subtraction of the reference heat flow) of the battery cells 111 and the battery unit 100, as originally detected by the battery heat flow detector(s) 120. As illustrated in FIG. 4, the originally-detected heat flow HFx of the battery cells 111 and battery unit 100 without subtraction of the reference heat flow of the battery unit 100 detected by the reference heat flow detector(s) 130 has an unstable baseline, making it impossible to output accurate values. Therefore, the shape of the heat flow with respect to the CCV is also different, and furthermore, the accuracy of detection of the SOC is reduced.

Figure 5:
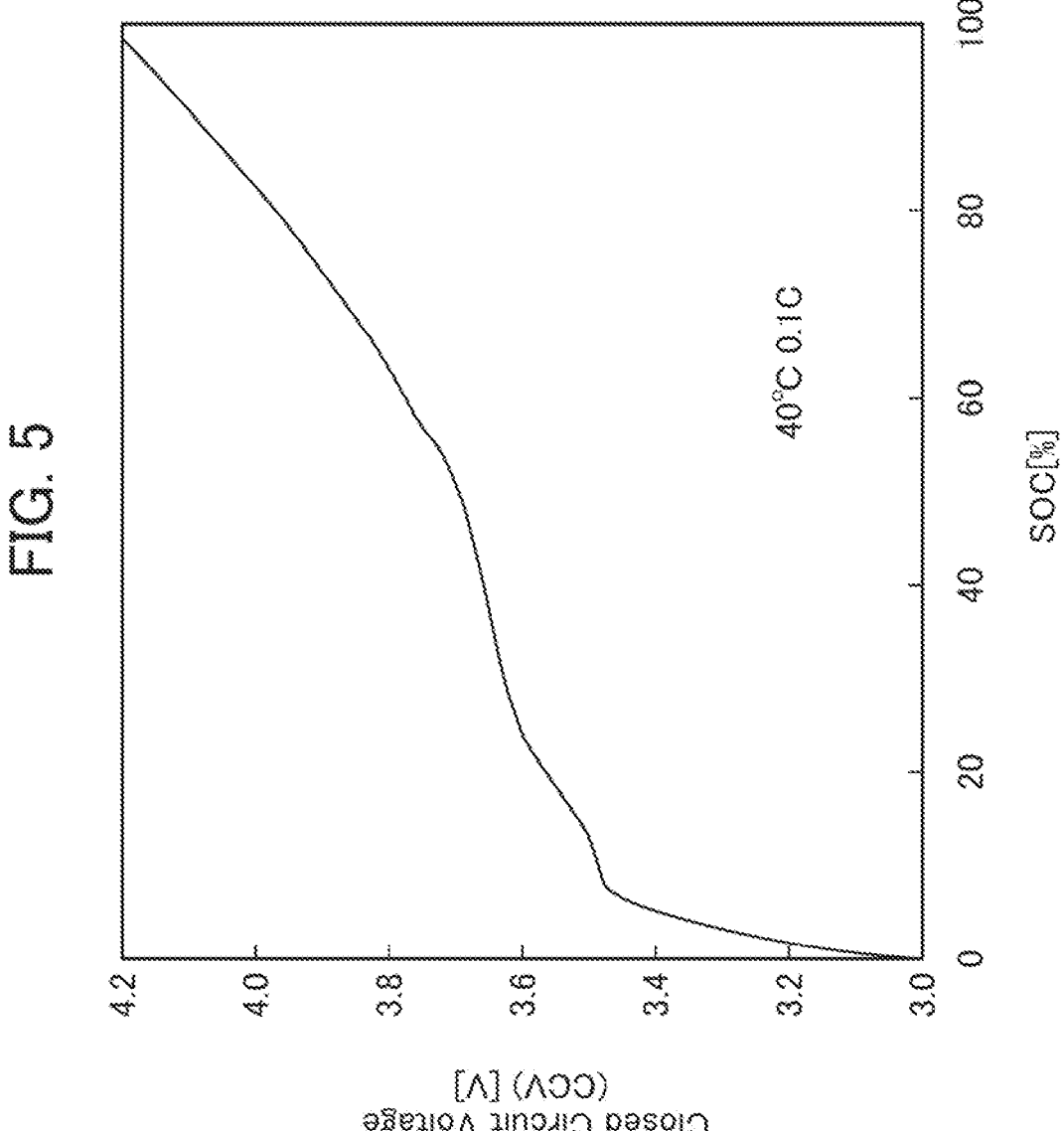
FIG. 5 is a graph illustrating an example of closed circuit voltage CCV-SOC characteristics of a comparative example.
Figure 6:
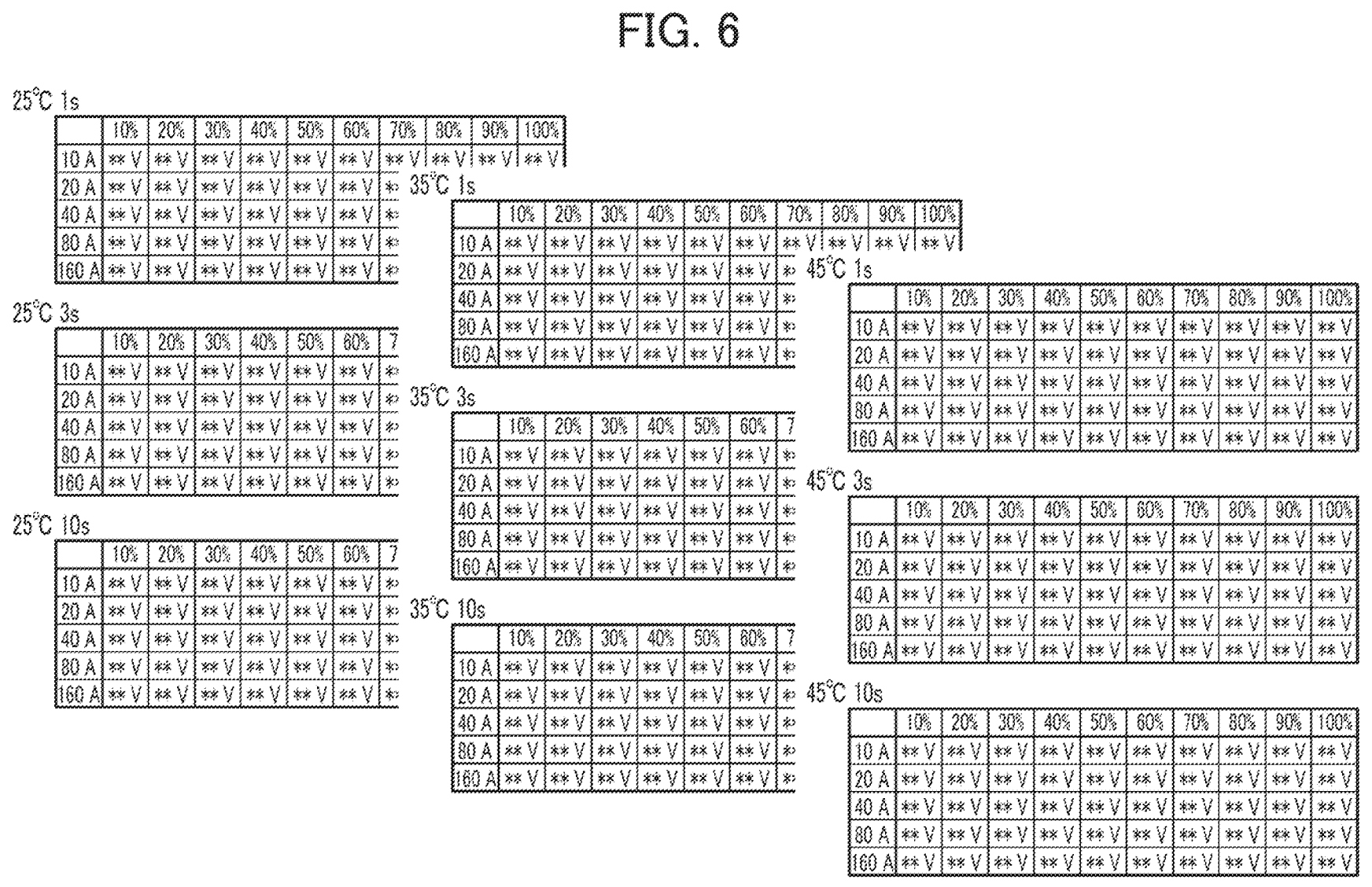

Here, SOC estimation based on the closed circuit voltage CCV-SOC reference characteristics (table map) of the comparative example is described. FIG. 5 illustrates an example of the closed circuit voltage CCV-SOC characteristics of the comparative example. FIG. 6 illustrates an example of the table map of the closed circuit voltage CCV-SOC reference characteristics of the comparative example. As illustrated in FIGS. 5 and 6, in the comparative example, a SOC corresponding to a detected closed circuit voltage CCV is estimated with reference to the previously stored CCV-SOC reference characteristics (e.g., initial characteristics), which are the CCV-SOC reference characteristics (table map) corresponding to detected temperatures and detected currents.

In the case of a battery cell in which a voltage has a gradient with respect to a change in capacity, such as a lithium-ion battery including hard carbon as a material forming the negative electrode, the SOC can be accurately estimated based on the voltage of the battery cell, as in the comparative example.

On the other hand, there have recently been battery cells in which a change in voltage is small with respect to a change in capacity, such as lithium-ion batteries including graphite as a material forming the negative electrode. In the case of a battery unit including battery cells of this type, if the SOC is estimated based on a voltage of the battery cells as in the comparative example, the accuracy of the estimation is expected to be reduced.

The present inventor(s) has found that in a lithium-ion battery cell including graphite as a material forming the negative electrode, a heat flow is generated when a phase transition occurs in the graphite, and a change in the heat flow of the battery cell is relatively large with respect to a change in the SOC.

According to the battery unit 100 of the present embodiment, since the SOC (battery cell state) is estimated based on the heat flow HF of the battery cells 111, even if the battery cells 111 are of a type in which a change in voltage is small with respect to a change in the SOC, a decrease in accuracy of the estimation of the SOC (battery cell state) can be inhibited.

In addition, the SOC (battery cell state) is estimated based on the heat flow HF of the battery cells 111, which is given by subtracting the reference heat flow detected by the reference heat flow detector(s) 130 from the heat flow detected by the battery heat flow detector(s) 120. That is, the SOC (battery cell state) is estimated based on the heat flow of the battery cells 111 that excludes the effects of various heat flows in the battery unit 100, namely the effects of noise. This feature can inhibit a decrease in the accuracy of the estimation of the SOC (battery cell state).

According to the battery unit 100 of the present embodiment, the reference heat flow detector(s) 130 is disposed at any of the following locations (A) to (F).

(A) Cooling plate 105 for cooling the battery modules 110
    (B) End plates 113 of the battery modules 110
    (C) Bus bar 114, 119 of the battery modules 110
    (D) Flange in the battery unit 100
    (E) Space within the battery unit 100
    (F) Pipe protecting the high-voltage conductor wire Due to this feature, the reference heat flow detector(s) 130 is appropriately disposed in the battery unit 100 at a location where temperature fluctuation is small and heat capacity is large.

According to the battery unit 100 of the present embodiment, the Peltier element can be used for both cooling the battery cells 111 and detecting the heat flow. For example, the Peltier element can be used as a heat flow sensor when a heat flow is to be detected, and otherwise, it can be used as a cooler.

(Estimation of SOH)

Next, an example of estimation of the SOH of the battery cells 111, which the battery state estimator 210 performs based on the heat flow of the battery cells 111, is described. The above-described estimation of the state of the battery cells based on the heat flow HF-SOC characteristic is applicable to the estimation of the SOH of the battery cells.

As described above, the battery state estimator 210 calculates the heat flow of the battery cells 111 and the battery unit 100 from the detection results of the battery heat flow detector(s) 120, and calculates the reference heat flow of the battery unit 100 from the detection results of the reference heat flow detector(s) 130. The battery state estimator 210 subtracts the reference heat flow of the battery unit 100 from the heat flow of the battery cells 111 and the battery unit 100 to calculate the heat flow HF (HFp, HFn) of the battery cells 111, as illustrated in FIG. 3. The heat flow of the battery cells 111 given by this calculation excludes the effects of various heat flows in the battery unit 100, namely the effects of noise. As illustrated in FIG. 3, the heat flow HFp of the battery cells 111 on the positive electrode side and the heat flow HFn of the battery cells 111 on the negative electrode side may be averaged to determine the heat flow HF of the battery cells 111.

When in actual use, the battery state estimator 210 periodically measures heat flow HF-SOC current characteristics during charge, and estimates the SOC of the battery cells based on the measured heat flow HF-SOC current characteristics and the heat flow HF-SOC initial characteristics stored in the storage 220.

According to the battery unit 100 of the present embodiment, since the SOH (battery cell state) is estimated based on the heat flow HF of the battery cells 111, even if the battery cells 111 are of a type in which a change in voltage is small with respect to a change in the SOH, a decrease in accuracy of the estimation of the SOH (battery cell state) can be inhibited.

In addition, the SOH (battery cell state) is estimated based on the heat flow HF of the battery cells 111, which is given by subtracting the reference heat flow detected by the reference heat flow detector(s) 130 from the heat flow detected by the battery heat flow detector(s) 120. That is, the SOH (battery cell state) is estimated based on the heat flow of the battery cells 111 that excludes the effects of various heat flows in the battery unit 100, namely the effects of noise. This feature can inhibit a decrease in the accuracy of the estimation of the SOH (battery cell state).

According to the battery unit 100 of the present embodiment, the reference heat flow detector(s) 130 is disposed at any of the following locations (A) to (F).

(A) Cooling plate 105 for cooling the battery modules 110
    (B) End plates 113 of the battery modules 110
    (C) Bus bar 114, 119 of the battery modules 110
    (D) Flange in the battery unit 100
    (E) Space within the battery unit 100
    (F) Pipe protecting the high-voltage conductor wire Due to this feature, the reference heat flow detector(s) 130 is appropriately disposed in the battery unit 100 at a location where temperature fluctuation is small and heat capacity is large.

According to the battery unit 100 of the present embodiment, the Peltier element can be used for both cooling the battery cells 111 and detecting the heat flow. For example, the Peltier element can be used as a heat flow sensor when a heat flow is to be detected, and otherwise, it can be used as a cooler.

The above-described embodiment is not intended to limit the present disclosure, and various changes and modifications can be made to the present disclosure.

EXPLANATION OF REFERENCE NUMERALS

100: Battery Unit
101: Case
102: Cover
103: Lower Frame
104: Upper Frame
105: Cooling Plate
106: Air Introduction Mechanism
110: Battery Module
111: Battery Cell
112: Stack
113: End Plate
114: Cell Bus Bar
119: Module Bus Bar
120: Battery Heat Flow Detector
130: Reference Heat Flow Detector
141: Voltage Detector
142: Current Detector
143: Temperature Detector
200: Battery Management System (BMS)
210: Battery State Estimator
220: Storage

What is claimed is:

1. A battery unit comprising:

at least one battery module that includes at least one battery cell;

at least one battery heat flow detector that detects a heat flow of the at least one battery cell and the battery unit;

at least one reference heat flow detector that detects a heat flow of the battery unit as a reference heat flow;

a cooling plate for cooling the at least one battery module; and a battery state estimator that estimates a state of the at least one battery cell, based on a heat flow of the at least one battery cell given by subtracting the reference heat flow detected by the at least one reference heat flow detector from the heat flow detected by the at least one battery heat flow detector, wherein the at least one battery module comprises a stack including the at least one battery cell comprising a plurality of battery cells stacked together, and a stack including the at least one battery cell comprising a plurality of battery cells stacked together;

wherein the at least one battery heat flow detector is disposed on or adjacent to at least one of the plurality of battery cells; and wherein the at least one reference heat flow detector is disposed in the battery unit at a location where temperature fluctuation is small and heat capacity is large and disposed on or adjacent to a surface of the cooling plate, the surface not facing the plurality of battery cells.

2. The battery unit according to claim 1, wherein the at least one battery heat flow detector and the at least one reference heat flow detector each include a temperature sensor that detects a temperature as the respective heat flow.

3. The battery unit according to claim 1, wherein the at least one battery heat flow detector comprises a plurality of battery heat flow detectors, two of which are disposed on or adjacent to ones of the plurality of battery cells, the ones being located next to the end plates.

4. The battery unit according to claim 3, wherein the plurality of battery heat flow detectors further include one battery heat flow detector disposed on or adjacent to one of the plurality of battery cells, the one being located at a center of the battery module.

5. The battery unit according to claim 1, wherein a thermocouple is installed at a location where the at least one battery heat flow detector or/and the at least one reference heat flow detector is/are disposed.

6. The battery unit according to claim 1, wherein the state of the at least one battery cell is a state of charge SOC or a state of health SOH.

7. The battery unit according to claim 1, wherein the at least one battery heat flow detector and the at least one reference heat flow detector are each a Peltier element.

\* \* \* \* \*